United States Patent [19]
Harada

[11] Patent Number: 6,091,144
[45] Date of Patent: Jul. 18, 2000

[54] SEMICONDUCTOR PACKAGE

[75] Inventor: Hisashi Harada, Tokyo, Japan

[73] Assignee: Mitsubishi Denki Kabushiki Kaisha, Tokyo, Japan

[21] Appl. No.: 08/790,853

[22] Filed: Feb. 3, 1997

[30]     Foreign Application Priority Data

Sep. 9, 1996  [JP]  Japan .................................. 8-238054

[51] Int. Cl.⁷ ............................. H01L 23/34; H01L 23/02
[52] U.S. Cl. ...................... 257/724; 257/723; 257/924; 438/190
[58] Field of Search .................... 257/724, 924, 257/723, 666, 676; 361/821; 438/190

[56]           References Cited

U.S. PATENT DOCUMENTS

| 5,095,402 | 3/1992 | Hernandez et al. | 257/724 |
| 5,200,364 | 4/1993 | Loh | 257/696 |
| 5,234,857 | 8/1993 | Kim et al. | 438/389 |
| 5,428,245 | 6/1995 | Lin et al. | 257/924 |
| 5,600,175 | 2/1997 | Orthmann | 257/924 |

FOREIGN PATENT DOCUMENTS

| 61-35544 | 2/1986 | Japan . |
| 63-75043 | 5/1988 | Japan . |
| 63-132459 | 6/1988 | Japan . |
| 2-158147 | 6/1990 | Japan .................................. 257/924 |
| 3-94452 | 4/1991 | Japan . |
| 4-79264 | 3/1992 | Japan . |

*Primary Examiner*—Mahshid Saadat
*Assistant Examiner*—Jhihan B Clark
*Attorney, Agent, or Firm*—Burns, Doane, Swecker & Mathis, LLP

[57]           ABSTRACT

A semiconductor package in which a semiconductor chip 16 is formed above a die pad 12 interposing a capacitor 22 therebetween, or the semiconductor chip 16 and the capacitor 22 in a vortex-shaped form are respectively formed on both faces of the die pad 12, or the condensers 22 are formed on both faces of the die pad 12 and the semiconductor chip 16 is formed on one of the condensers 22, and the die pad 12, the semiconductor chip 16 and the condensers 22 are sealed by resin by which adverse effect of noise is reduced, wherein the shape of the capacitor may be in a vortex-shaped form or opposed faces of metal layers may be roughened.

19 Claims, 9 Drawing Sheets

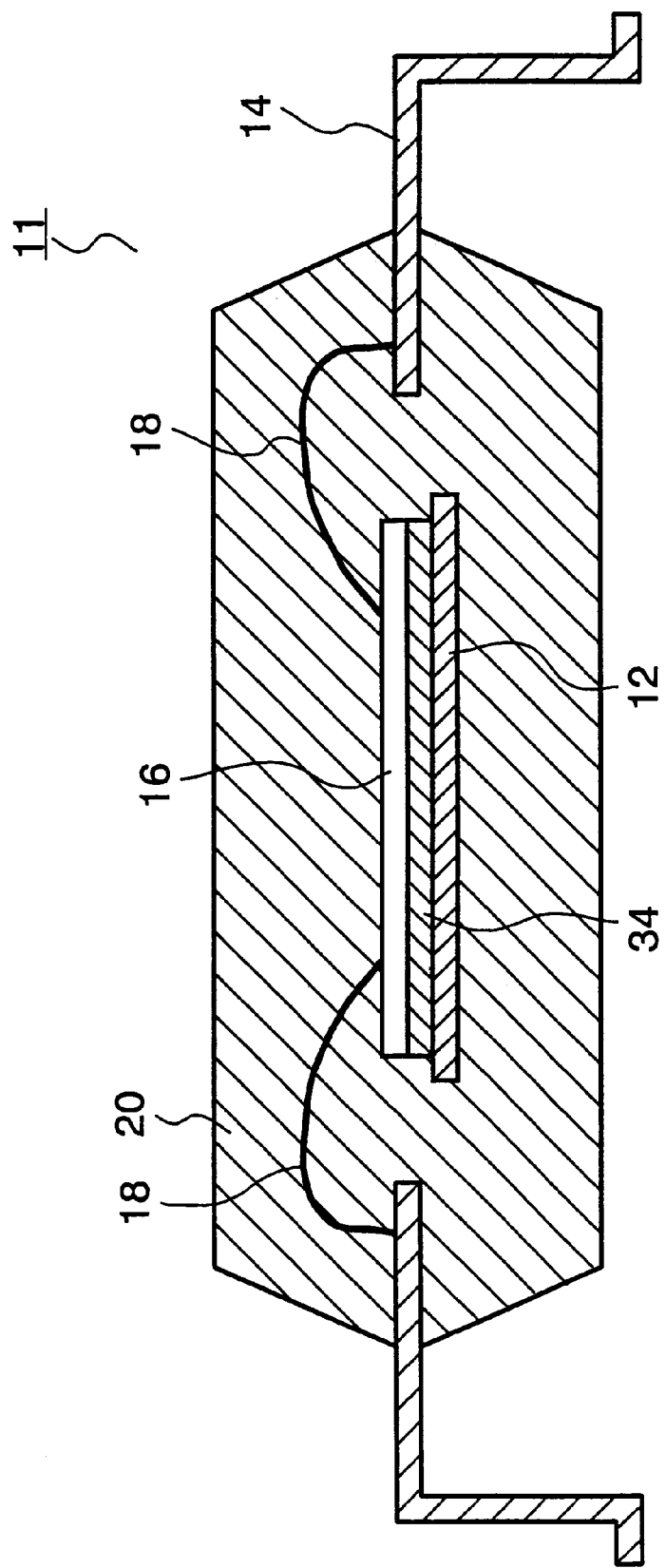

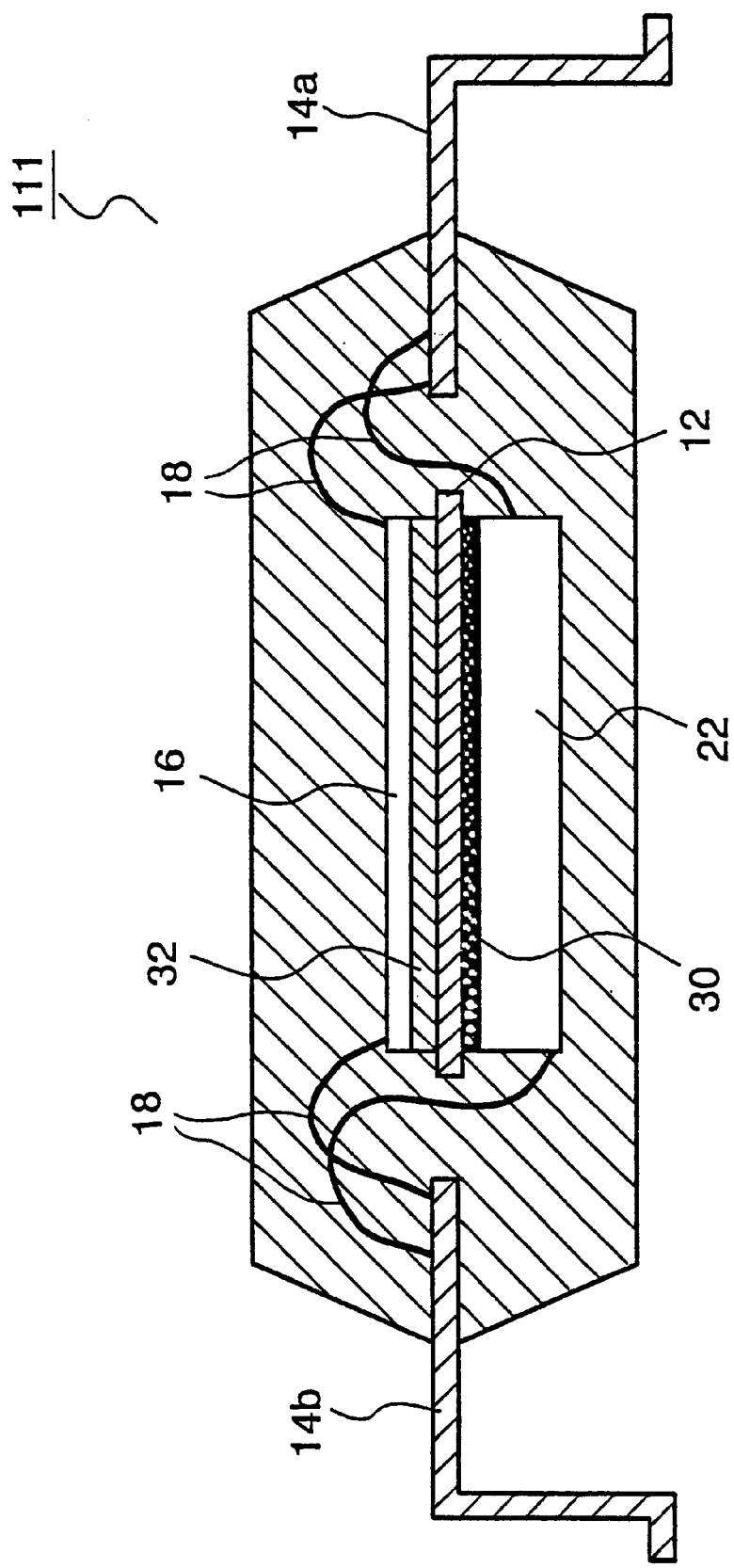

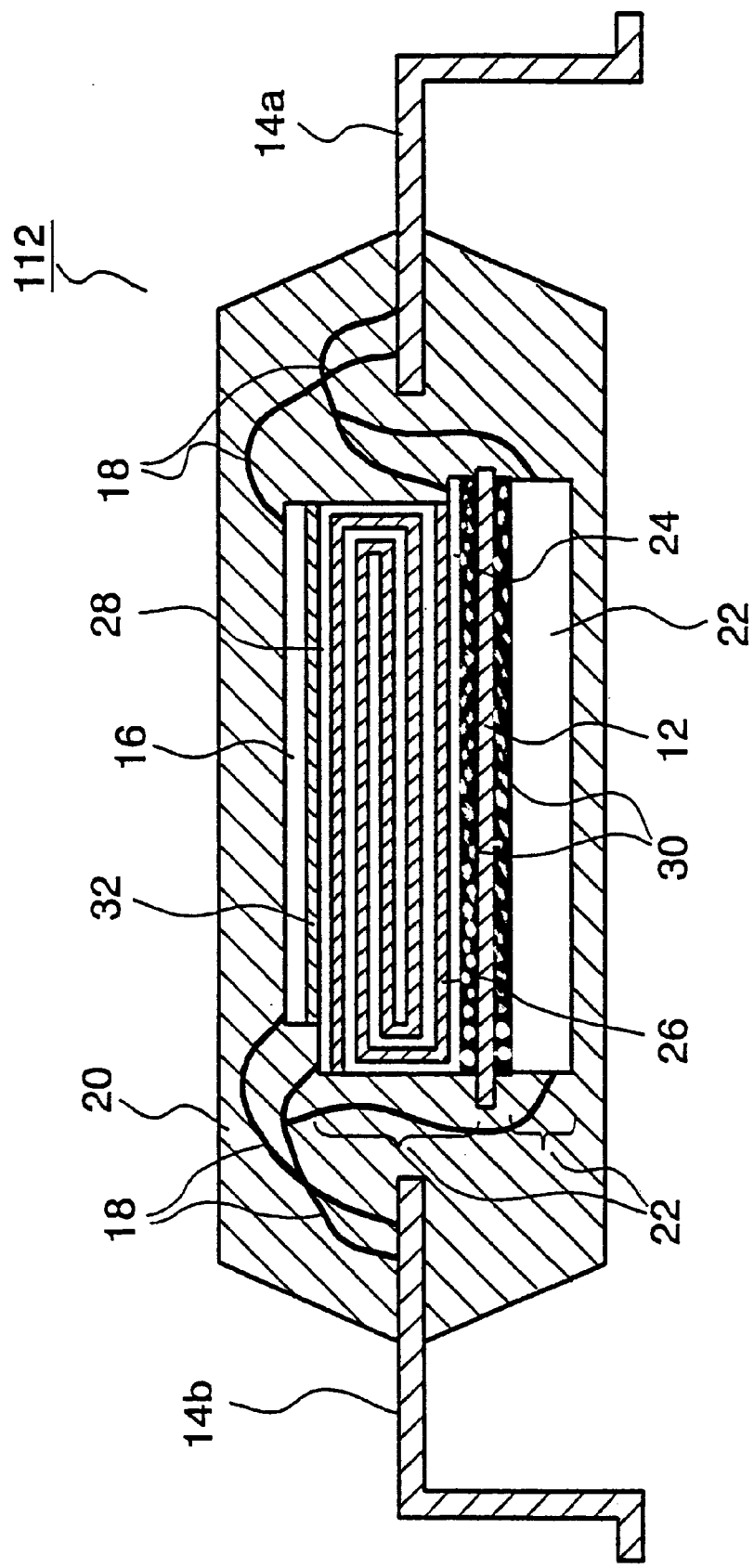

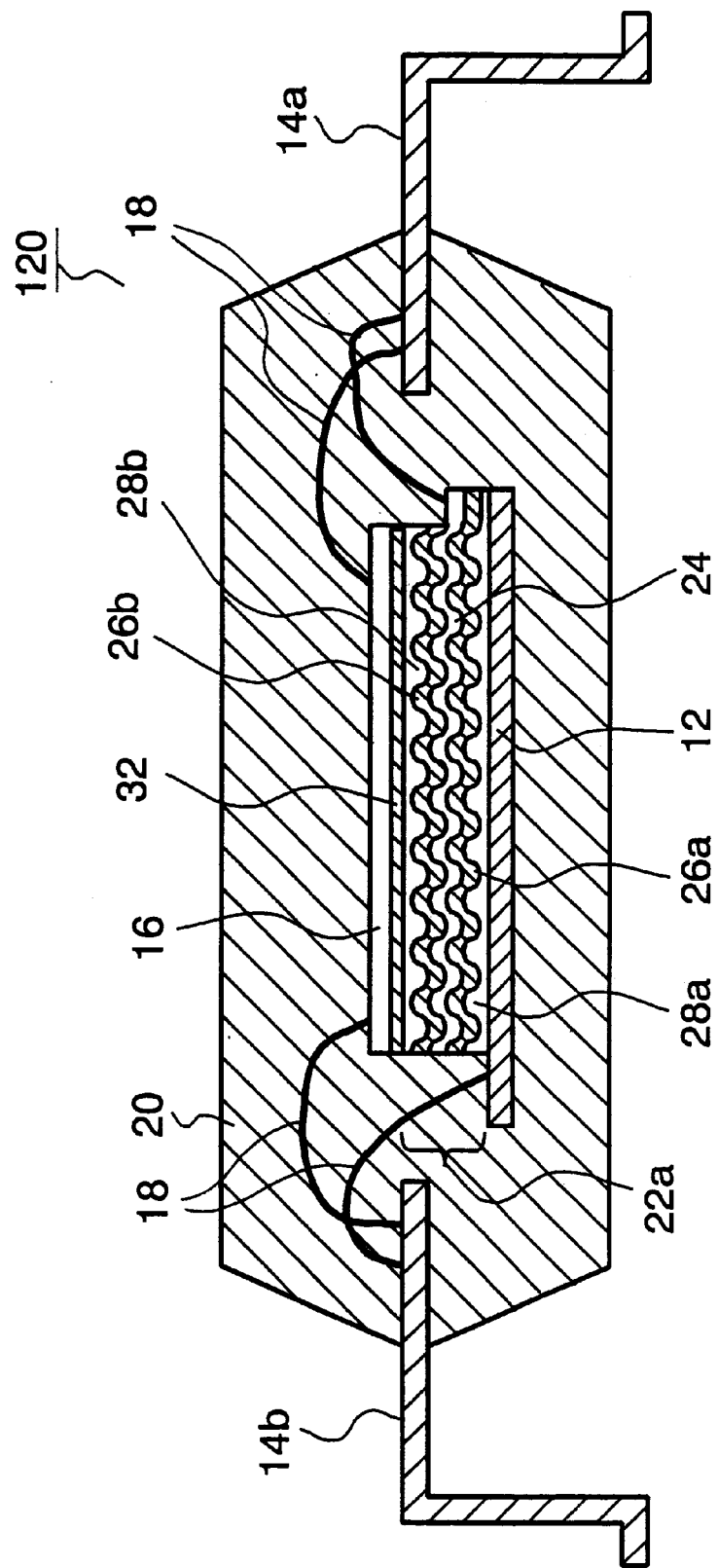

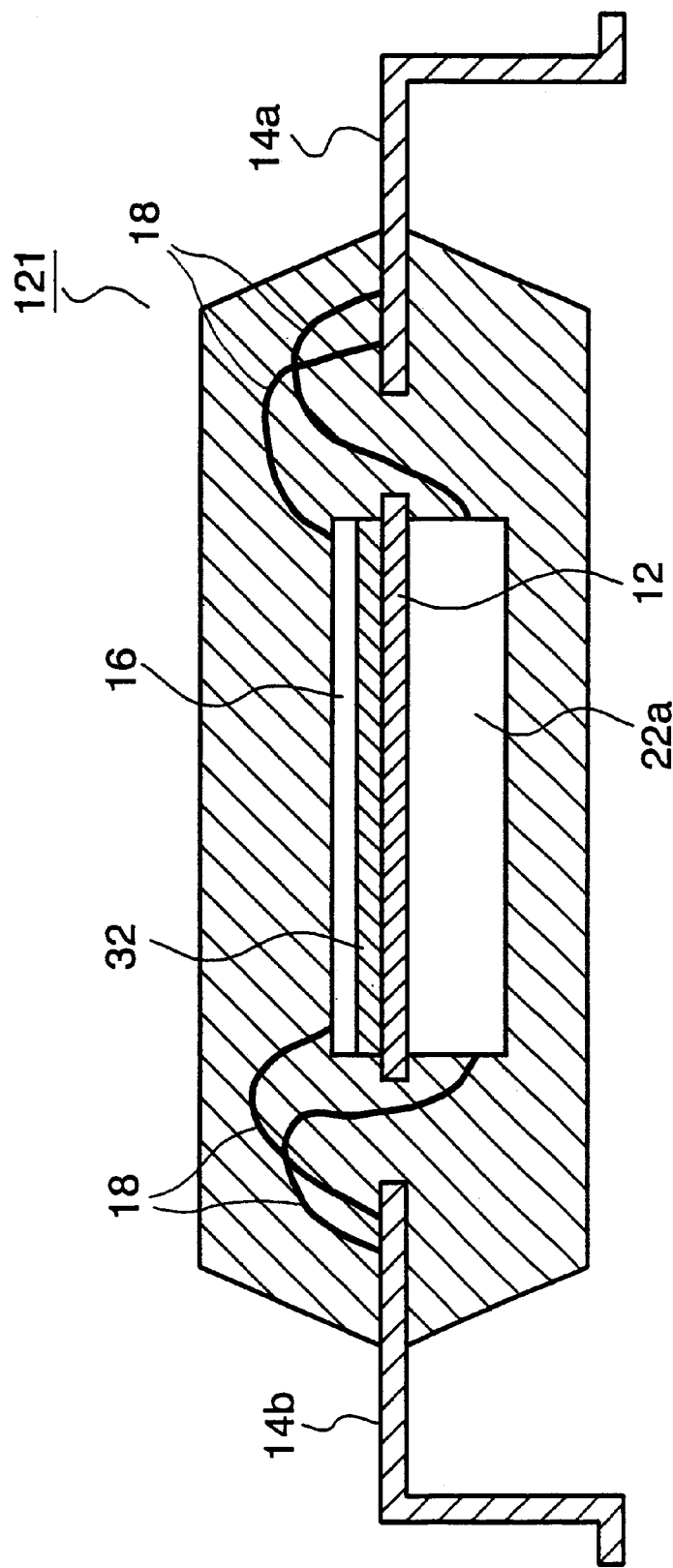

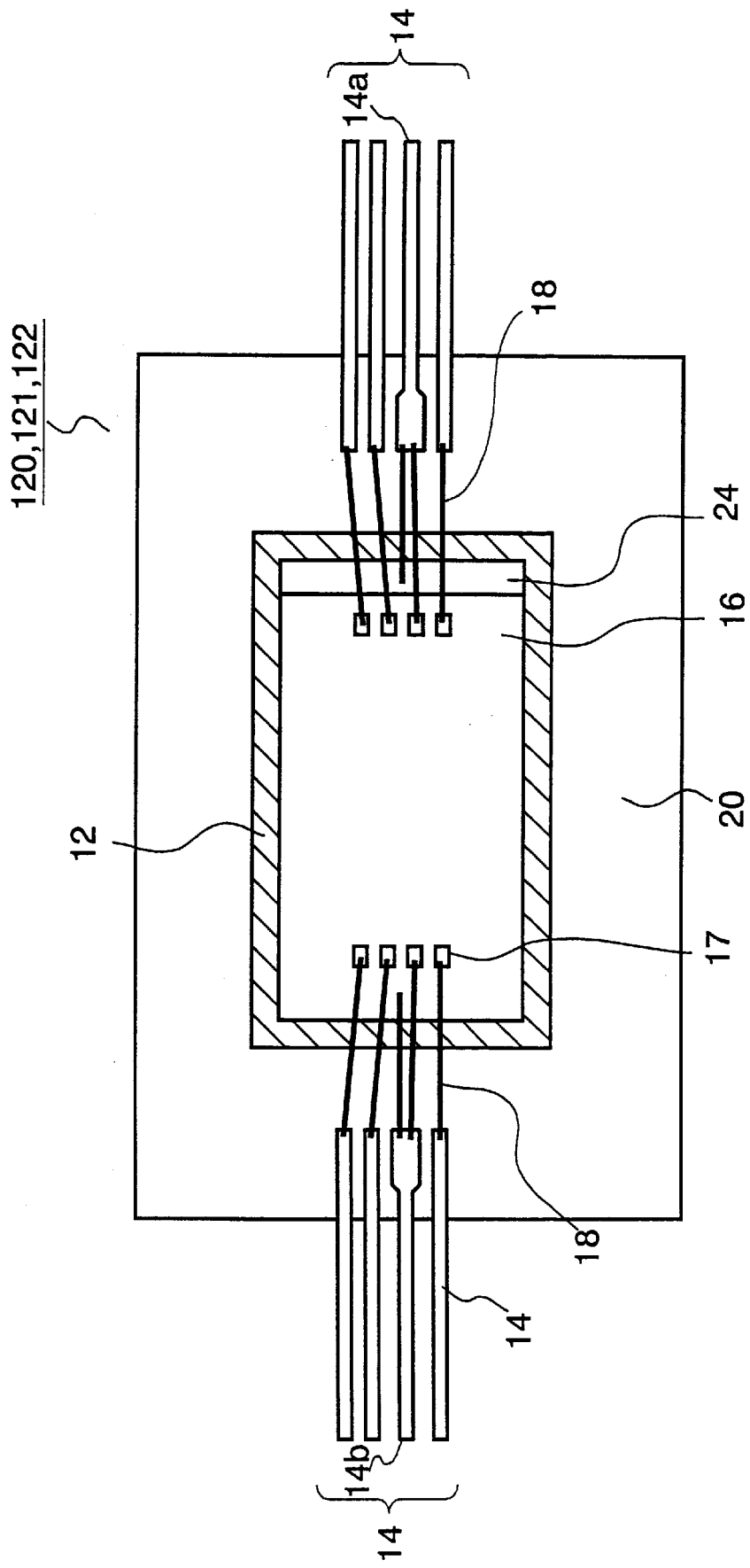

SEMICONDUCTOR PACKAGE

BACKGROUND OF THE INVENTION

1. Field of the Invention

The present invention relates to a semiconductor package in which adverse effects associated with by noise is reduced by absorbing the noise.

2. Description of the Related Art

FIG. 1 is a sectional view of a conventional semiconductor package where numeral 11 designates a resin-sealed type semiconductor package, numeral 12 designates a die pad, numeral 14 designates a lead, numeral 16 designates a semiconductor chip and numeral 18 designates a bonding wire for connecting pads formed on the surface of the semiconductor chip 16 to the leads 14. Numeral 20 designates a mold resin for sealing the die pad 12, the semiconductor chip 16, the bonding wire 18 and the like thereby preventing moisture outside the package 11 from invading into the inside of the semiconductor package 11 and protecting the semiconductor chip 16 and the like against impacts. Numeral 34 designates a die bonding resin for die-bonding the semiconductor chip 16 onto the die pad 12.

Next, an explanation will be given of the operation of the conventional semiconductor package illustrated by FIG. 1.

The semiconductor chip 16 is an individual semiconductor chip which has been obtained by dividing a wafer after a wafer production process. The semiconductor chip 16 is fixed on the die pad 12 by the die bonding resin 34. Next, the electrode pads formed on the surface of the semiconductor chip 16 are connected to the leads 14 by the bonding wires 18 through the wire bonding process. Thereafter, the die pad 12, the semiconductor chip 16, the bonding wires 18 and the like are sealed by the mold resin 20 whereby the fabrication process of the semiconductor package 11 is completed.

The back face of the semiconductor chip 16 is fixed to the inside of the semiconductor package 11 by being adhered onto the die pad 12 by the die bonding resin 34. The electrode pads formed on the surface of the semiconductor chip 16 are electrically connected to the corresponding leads 14 by the bonding wires 18.

The semiconductor package 11 is mounted on a printed circuit board, not illustrated, by soldering portions (outer leads) of the leads 14 which project out to the outside of the semiconductor package 11, to wirings of the printed circuit board and thereafter, integrated to various electrical devices.

The semiconductor chip 16 receives power supplied from wirings (for example, printed wiring) of the printed circuit board, and inputs or outputs various signals such as data or control signals to or from outside integrated circuit devices (such as IC, LSI and the like), display devices (such as LCD) or the like via the printed wirings.

The current path between the semiconductor chip 16 and the printed wiring on a printed circuit board, is constituted by the printed wiring—the lead 14—the bonding wire 18—the electrode pad—the semiconductor chip 16.

The mold resin 20 seals the die pad 12, the leads 14, the semiconductor chip 16, the bonding wires 18 and the like except portions of the leads 14 (outer lead) projected to the outside of the semiconductor package 11 thereby protecting the semiconductor package 11 such that no moisture or no water invades from the outside, and protects against impacts applied from the outside.

The handling of the semiconductor chip 16 is facilitated by sealing it to the inside of the semiconductor package 11 since it is protected against the influence of outside moisture or impact which gives rise to an effect by which the mounting of the semiconductor chip 16 onto a printed circuit board that is mounted to various electric devices, is facilitated.

The conventional semiconductor package 11 with the above-described configuration has the following drawback.

With respect to the semiconductor chip 16, formation of a further fine structures in the tendency with higher integration for the purposes of high capability, high function, low cost and the like. With the formation of fine structures, erroneous operation of the semiconductor chip 16 caused by noise introduced from the outside or adverse effect on external circuits due to noise generated at the inside of the semiconductor chip 16, is becoming cumbersome.

It is considered that the cause of such a noise problem is that, since parasitic capacitances produced in forming to integrate transistors at the inside of the semiconductor chip 16, or the capacitances of capacitors formed on the surface of the semiconductor chip 16, are reduced with the formation of a fine structure of the design rule and accordingly, noise derived from the outside or noise generated at the inside of the chip cannot be absorbed by these capacitors.

A plurality of transistors integrated at the inside of the semiconductor chip 16 are operated by clocks. The clock is supplied from the outside of the semiconductor package 11, or the clock is generated by using an oscillator, or the clock is formed by a method of oscillation using a CR circuit, or the like. Such a clock is supplied to a plurality of circuits comprising transistors.

When the level of the clock is changed (rise or fall), the transistor is turned on or off and accordingly, a penetrating current flows from a power supply to the ground whereby the level of the power supply voltage is fluctuated. The fluctuation of the power supply voltage constitutes a noise that is generated from the inside of the semiconductor chip 16.

With respect to a semiconductor chip in the past generation where the design rule of the transistor was large, parasitic capacitances of transistors or capacitances of capacitors formed at the inside of transistors are large and therefore, the fluctuation of the power supply voltage can be absorbed by the parasitic capacitances of transistors or capacitors formed at the inside of the semiconductor chip.

However, when the design rule becomes small with higher integration and fine structure formation of a semiconductor integrated circuit device, the parasitic capacitances of transistors are reduced and the capacitances of capacitors formed at the inside of the semiconductor chip are getting smaller since the area thereof is reduced and accordingly, the fluctuation of the power supply voltage cannot be absorbed by the parasitic capacitances of transistors or the capacitors formed at the inside of the semiconductor chip.

Further, with the reduction in the design rule, transistors are operated at a higher speed whereby further fluctuation of the power supply voltage is produced and as a result, further noise is caused.

When noise (hereinafter, referred to as "power supply noise") is superposed on the power supply voltage supplied from the outside of the package via printed wirings or the like, the power supply voltage supplied to the semiconductor chip 16 is fluctuated whereby erroneous operation is caused. When the design rule is large, such a power supply noise can be absorbed by the parasitic capacitances of transistors or the capacitances of capacitors formed at the inside of the semiconductor chip. However, with the reduction in the design rule, the power supply noise cannot be absorbed by the reason described above.

SUMMARY OF THE INVENTION

The present invention has been carried out to solve the problem of the conventional semiconductor package and it is an object of the present invention to provide a semiconductor package capable of absorbing noise derived from the outside or noise generated inside of a semiconductor package which become troublesome with the formation of a fine structures of a semiconductor chip whereby erroneous operation of the semiconductor chip can be prevented and adverse effect of noise on external circuits can be reduced.

According to a preferred aspect of the present invention, a semiconductor package is formed by a semiconductor chip and a first capacitor in a spiral-shaped form and the semiconductor chip and the first capacitor in a spiral-shaped form are connected to leads and sealed in the same package.

The semiconductor package is provided with a die pad, the first capacitor in a vortex-shaped form adhered onto a first face of the die pad and the semiconductor chip die-bonded onto the first capacitor in a spiral-shaped form.

The semiconductor package is provided with a die pad, the semiconductor chip die-bonded onto a first face of the die pad and the first capacitor in a spiral-shaped form adhered onto a second face of the die pad.

The semiconductor package is provided with a die pad, the first capacitor in a vortex-shaped form adhered onto a first face of the die pad, the semiconductor chip die-bonded onto the first capacitor in a spiral-shaped form and a second capacitor in a vortex-shaped form adhered onto a second face of the die pad.

According to another preferred aspect of the present invention, a semiconductor package is formed by a semiconductor chip and a capacitor at least one surface of opposed electrodes of which is roughened and the semiconductor chip and the capacitor are connected to leads and are sealed in the same package.

The semiconductor package is provided with a die pad, the capacitor adhered onto a first face of the die pad and the semiconductor chip die-bonded onto the condenser.

The semiconductor package is provided with a die pad, the semiconductor chip die-bonded onto a first face of the die pad and the capacitor adhered onto a second face of the die pad.

The semiconductor package is provided with a die pad, a capacitor in a spiral-shaped form adhered onto a first face of the die pad, the semiconductor chip die-bonded onto the capacitor in a spiral-shaped form and the capacitor at least one surface of opposed electrodes of which is roughened, which is adhered onto the second face of the die pad.

In the semiconductor package, each of the condensers in a spiral-shaped form, comprises a metal layer for a power source, a metal layer for grounding and a die electric body formed between the metal layer for a power supply and the metal layer for grounding.

In the semiconductor package, faces of the metal layer for a power supply and metal layer for grounding opposing each other are roughened and the shape of the faces is formed by a plurality of waves, or a plurality of dimples or a plurality of projections.

BRIEF DESCRIPTION OF THE DRAWINGS

These and other objects, features, aspects and advantages of the present invention will become more apparent from the following detailed description of the present invention when taken in conjunction with the accompanying drawings, in which:

FIG. 1 is a sectional view of a conventional semiconductor package;

FIGS. 2A, 2B and 2C are sectional views of semiconductor packages in accordance with Embodiment 1 of the present invention;

FIGS. 4A, 4B and 4C are sectional views of semiconductor packages according to Embodiment 2 of the present invention; and FIG. 5 is a top perspective view of the semiconductor packages according to Embodiment 2 illustrated by FIGS. 4A, 4B and 4C.

DETAILED DESCRIPTION OF THE PREFERRED EMBODIMENTS

Other features of this invention will become apparent through the following description of preferred embodiments which are given for illustration of the invention and are not intended to be limiting thereof. Preferred embodiments of a semiconductor package according to the present invention will now be described with reference to the drawings.

Embodiment 1

Figure 2A:
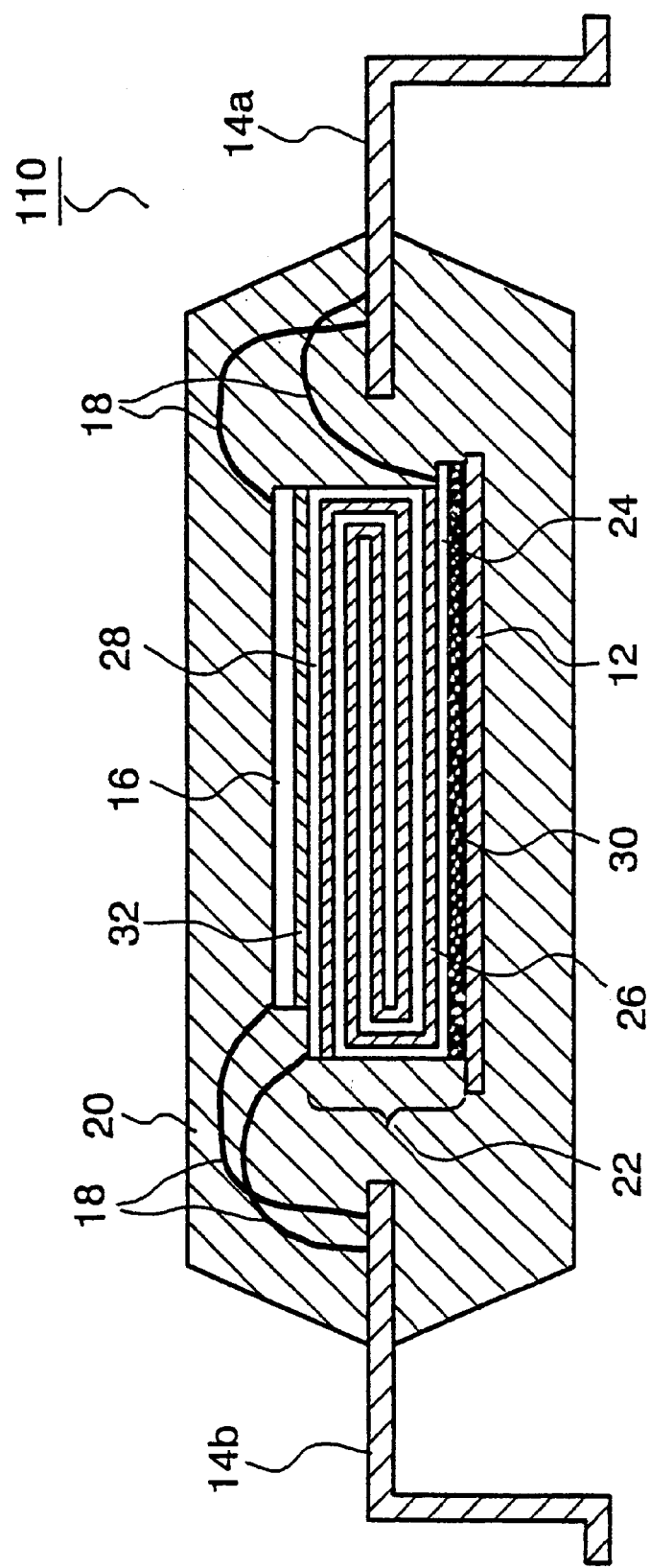

FIG. 2A is a sectional view of a semiconductor package according to Embodiment 1 of the present invention where numeral 110 designates a resin-sealed type semiconductor package, numeral 12 designates a die pad, numeral 14 (including 14a and 14b) designate leads, numeral 16 designates a semiconductor chip and numeral 18 designates bonding wires. The bonding wires 18 are for connecting the pads formed on the surface of the semiconductor chip 16 to the leads 14. Numeral 20 designates a mold resin for sealing the die pad 12, the semiconductor chip 16, the bonding wires 18 and the like for preventing invasion of moisture or water from the outside of the semiconductor package 110 and protecting the semiconductor chip 16 and the like against impact.

Numeral 22 designates a capacitor for eliminating or absorbing noises, numeral 24 designates a metal layer for a power supply constituting the capacitor 22, numeral 26 designates a dielectric layer constituting the capacitor 22 and numeral 28 designates a metal layer for grounding constituting the capacitor 22. Numeral 30 designates an adhesive agent for adhering the capacitor 22 onto the die pad 12. Numeral 32 designates a die bonding resin for die-bonding the semiconductor chip 16 onto the capacitor 22.

In the semiconductor package 110 according to Embodiment 1, the capacitor 22 in a spiral-shaped form is adhered onto the die pad 12 and then the semiconductor chip 16 is die-bonded onto the capacitor 22.

Next, an explanation will be given of the operation of the semiconductor package 110 according to Embodiment 1 illustrated by FIG. 2A.

The capacitor 22 is formed by rolling the die electric layer 26 sandwitched by the metal layer 24 for a power supply and the metal layer 28 for grounding into a spiral-shaped form and thereafter pressing to flatten the aggregation. Accordingly, a large capacity with a small volume can be provided by making the shape of the capacitor 22 into a spiral-shaped form.

The capacitor 22 formed as described above is adhered onto the die pad 12 by the adhesive agent 30. The semiconductor chip 16 is die-bonded by the die bonding resin 32 onto the capacitor 22 that is adhered onto the die pad 12.

Figure 3:
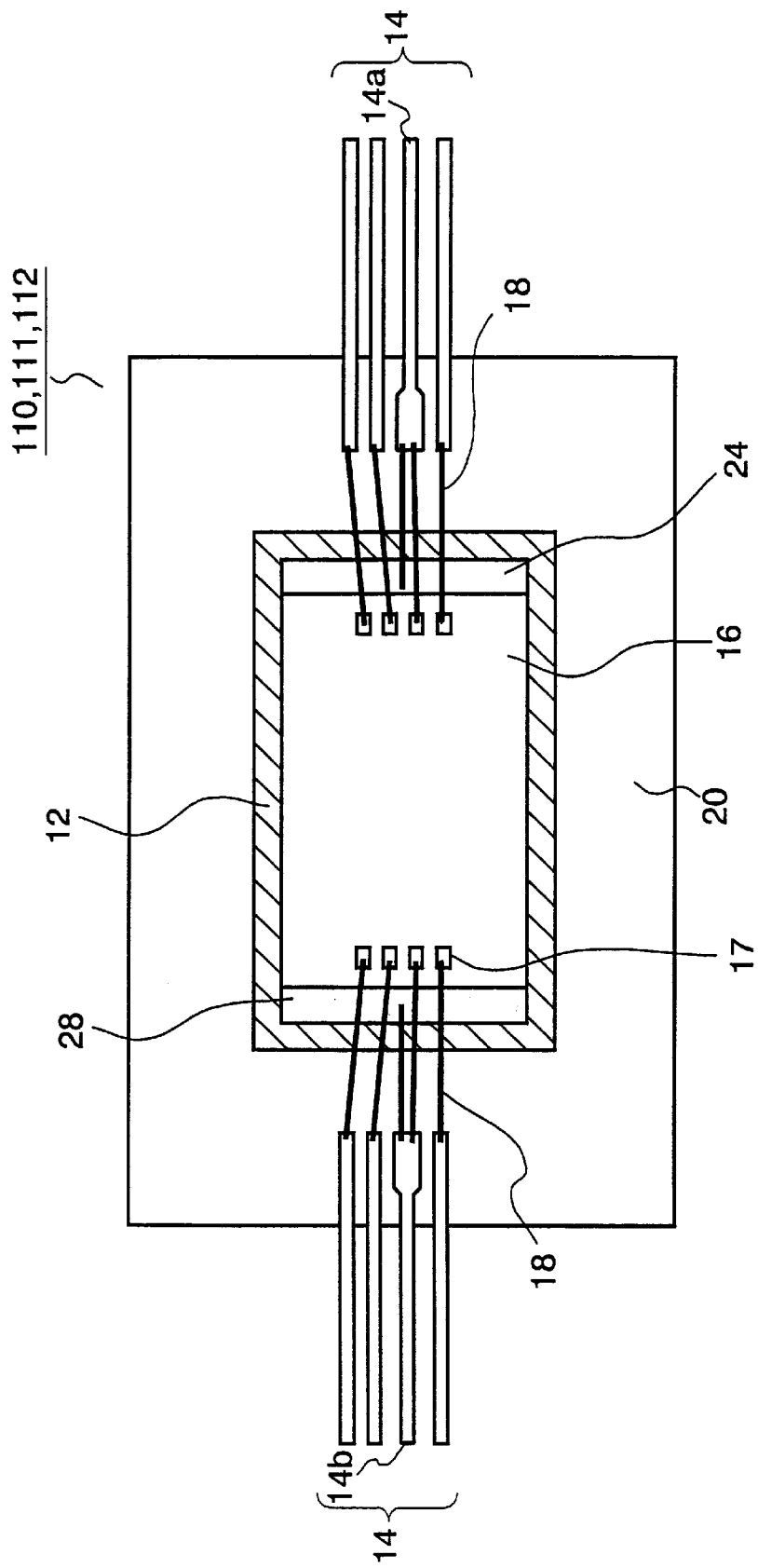
FIG. 3 is a top perspective view of the semiconductor packages according to Embodiment 1 illustrated by FIGS. 2A, 2B and 2C.

Next, the wire bonding is carried out. FIG. 3 is a top perspective view of the semiconductor package 110 according to Embodiment 1 illustrated by FIG. 2A in which notation 14a designates leads for a power source, notation 14b designates leads for grounding and numeral 17 designates pads formed on the semiconductor chip 16.

An explanation will be given of the wire bonding in respect of the semiconductor package 110 according to Embodiment 1 in reference to FIG. 2A and FIG. 3 as follows.

The respective ones of the pads 17 and the leads 14 in a normal corresponding relationship are bonded by the bonding wires 18 through the wire bonding operation. According to Embodiment 1, the wire bonding is carried out further between the metal layer 24 for a power supply constituting the capacitor 20 and the leads 14a for a power source, and between the metal layer 28 for grounding constituting the capacitor 22 and the leads 14b for grounding by the bonding wires 18.

As described above, according to the semiconductor package 110 of Embodiment 1, the capacitor 22 is installed between the leads 14a for a power supply and the leads 14b for grounding at the inside of the semiconductor package 110. Therefore, noise generated at the inside of the semiconductor chip 16 caused by the fluctuation of the power supply voltage or the power supply noise superposed on the power supply voltage supplied from the outside can efficiently be eliminated.

The capacitor 22 formed in the semiconductor package 110 according to Embodiment 1 can be installed separately from parasitic capacitances of transistors or condensers formed at the inside of the semiconductor chip 16. The capacitor 22 having a capacitance larger than the capacitance of the parasitic capacitances of transistors or condensers can be formed at the inside of the semiconductor package 110. Therefore, the capacitance necessary for absorbing the fluctuation of the power supply voltage at the inside of the semiconductor chip 16 and the power supply noise from the outside can easily be secured.

Further, the circuit design of the semiconductor chip 16 is facilitated since condensers for removing noise need not to be formed at the inside of the semiconductor chip 16.

Although an example in which the capacitor 22 is provided on the upper face of the die pad 12 in the semiconductor package 110, has been described according to the above-described Embodiment 1, the capacitor 22 may be provided on the lower face of the die pad 12 as in a semiconductor package 111 illustrated by FIG. 2B. In this case, the die bonding step of adhering the semiconductor chip 16 onto the die pad 12 can be carried out without changing the conventional steps and therefore, the semiconductor package 111 has an advantage whereby an increase in cost accompanied by a change in manufacturing steps can be avoided.

Also, the condensers 22 can be provided on both of the upper face and the lower face of the die pad 22 as in a semiconductor package 112 illustrated by FIG. 2C. Thereby, the capacitance of condensers 22 can be made larger at the inside of the semiconductor package 112.

Although an explanation has been given of the semiconductor packages 110, 111 and 112 according to Embodiment 1 with an example of a resin-sealed type package as the semiconductor package, the present invention is not limited thereto but is applicable to packages of other types, for example, ceramic packages and the like.

Embodiment 2

FIG. 4A is a sectional view of a semiconductor package according to Embodiment 2 of the present invention where numeral 120 designates a resin-sealed type semiconductor package, numeral 12 designates a die pad, numerals 14a and 14b designate leads, numeral 16 designates the semiconductor chip and numeral 18 designates the bonding wires. The bonding wires 18 are for connecting the pads formed on the surface of the semiconductor chip 16 to the leads 14a and 14b. Numeral 20 designates a mold resin for sealing the die pad 12, the semiconductor chip 16, the bonding wires 18 and the like for preventing outside moisture or water from invading the inside of the semiconductor package 120 and protecting the semiconductor 120 against impact. Notation 22a designates a capacitor for removing noise, numeral 24 designates a metal layer for a power supply constituting the capacitor 22a, notations 26a and 26b designate dielectric layers constituting the capacitor 22a and notations 28a and 28b designate metal layers for grounding constituting the capacitor 22a. Numeral 32 designates a die bonding resin for die-bonding the semiconductor chip 16 onto the capacitor 22a.

In the semiconductor package 120 according to Embodiment 2, the capacitor 22a in which electrode layers (the metal layer 24 for a power source, the metal layers 28a and 28b for grounding) opposing each other via the dielectric layers 26a and 26b, are roughened, is adhered onto the die pad 12 and the semiconductor chip 16 is die-bonded onto the capacitor 22a.

Next, an explanation will be given of the operation of the semiconductor package 120 according to Embodiment 2 illustrated by FIG. 4A.

The capacitor 22a is manufactured by roughening both of the upper and the lower surfaces of the metal layer 24 for a power supply and thereafter covering the metal layers 28a and 28b for grounding of which opposed faces are roughened, onto the both surfaces of the metal layer 24 for a power supply via the dielectric layers 26a and 26b.

The surface area of the opposed electrodes constituting the capacitor 22a can be increased since the upper and lower faces of the metal layer 24 for a power supply and the opposed faces of the metal layers 28a and 28b for grounding are roughened whereby a large capacitance is provided with a small volume of the capacitor 22a. The roughening of the metal layer 24 for a power supply and metal layers 28a and 28b for grounding is realized by various shapes. For example, the metal layer 24 for a power supply and the metal layers 28a and 28b for grounding can be formed by a shape comprising a plurality of waves, a shape comprising a plurality of dimples or a shape comprising a plurality of projections.

The capacitor 22a formed as described above is mounted onto the die pad 12 by adhering the metal layer 28a for grounding onto the die pad 12 through soldering or the like. The semiconductor chip 16 is die-bonded by the die bonding resin 32 onto the metal layer 28b for grounding constituting the upper face of the capacitor 22a mounted on the die pad 22 and successively the wire bonding is carried out.

FIG. 5 is a top face perspective view of the semiconductor package 120 illustrated by FIG. 4A and semiconductor packages 121 and 122 illustrated by FIGS. 4B and 4C, mentioned later, where notation 14a designates the lead for a power source, notation 14b designates the lead for grounding and numeral 17 designates the pads formed on the semiconductor chip 16.

An explanation will be given of the wire bonding on the semiconductor package 120 in reference to FIG. 4A and FIG. 5.

The respective ones of the pads 17 and the leads 14 in a normal corresponding relationship are bonded to each other by the bonding wires 18 through the wire bonding process. According to Embodiment 2, the wire bonding is further carried out between the metal layer 24 for a power supply constituting the capacitor 22a and the lead 14a for a power source, between the die pad 12 and the lead 14b for grounding. The metal layer 28a for grounding on the lower side is electrically connected to the die pad 12 and therefore, the metal layer 28a for grounding constituting the capacitor 22a is grounded by connecting the die pad 12 to the lead 14b for grounding by the bonding wires 18.

The metal layer for grounding 28b on the upper side is electrically connected to the lower face of the semiconductor chip 16 by the die bonding resin 32 and therefore, the metal layer 28b for grounding is grounded via the pads 17 for grounding formed on the semiconductor chip 16.

As described above, according to the semiconductor package 120 of Embodiment 2, the capacitor 22a is installed between the leads 14a for a power supply and the leads 14b for grounding in the semiconductor package 120 and therefore, noise generated at the inside of the semiconductor chip 16 caused by the fluctuation of the power supply voltage or the power supply noise superposed on the power supply voltage supplied from the outside can efficiently be eliminated.

The capacitor 22a according to Embodiment 2 can be formed separately from the parasitic capacitances of transistors in a different fabrication process or the condensers formed in the semiconductor chip 16. Further, the capacitor 22a having a capacitance whose magnitude is larger than that of the parasitic capacitances of transistors or the capacitances of the condensers, can be formed. Therefore, the capacitance necessary for absorbing the fluctuation of the power supply voltage in the semiconductor chip 16 or the power supply noise from the outside can easily be secured.

Also, the circuit design of the semiconductor chip 16 is facilitated since condensers for removing noise need not to be formed on the semiconductor chip 16.

Although an example of the capacitor 22a where two layers of the metal layers 28a and 28b for grounding are attached on both of the upper and the lower faces of the metal layer 24 for a power supply via the dielectric layers 26a and 26b has been shown in the semiconductor package 120 according to Embodiment 2, one layer of the metal layer for grounding may be opposed to the metal layer 24 for a power source. In this case the capacitor 22a is constituted only by the dielectric layer 26a on the lower face of the metal layer 24 for power supply and the metal layer 28a for grounding. Also, the die pad 12 may be made the metal layer for grounding by omitting the metal layer 28a for grounding.

Although an example where all the surfaces of the metal layer 24 for a power source and two layers of the metal layers 28a and 28b for grounding constituting the capacitor 22a, are roughened in the semiconductor package 120 of Embodiment 2 illustrated by FIG. 4A, the roughening may be carried out on either one of the two opposed metal layers.

Although an example of providing the capacitor 22a on the upper face of the die pad 12 has been shown in the semiconductor package 120 according to Embodiment 2 illustrated by FIG. 4A, the capacitor 22a may be provided on the lower face of the die pad 12 as in a semiconductor package 121 illustrated by FIG. 4B. In this case the die bonding step of adhering the semiconductor chip 16 onto the die pad 12 is carried out without changing the conventional steps and accordingly, the semiconductor package 121 is provided with an advantage whereby an increase in cost accompanied by a change in manufacturing steps can be avoided.

Figure 4C:
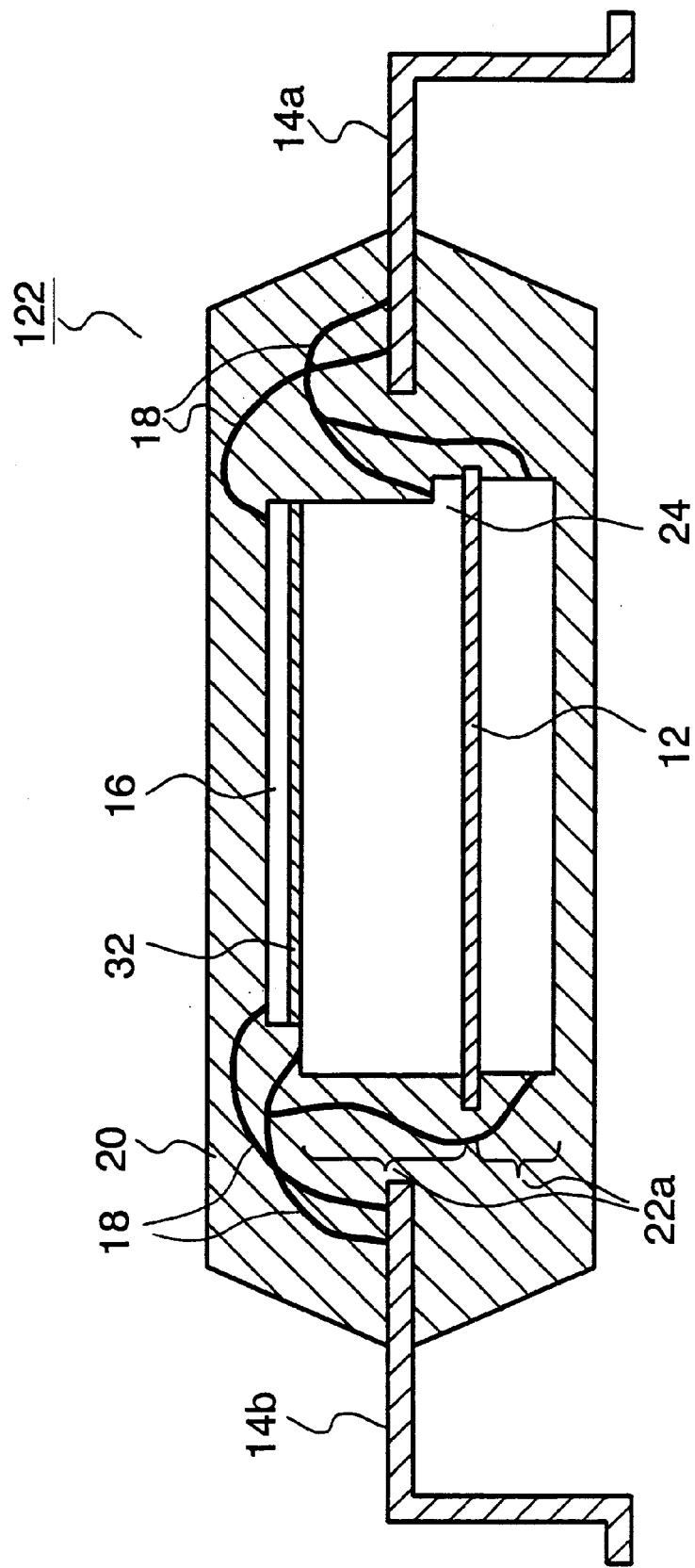

Furthermore, the condensers 22a can be provided on both of the upper face and the lower face of the die pad 12 as in a semiconductor package 122 illustrated by FIG. 4C. Thereby, a larger capacity can be provided.

Although an explanation has been given of the semiconductor packages 120, 121 and 122 according to Embodiment 2 illustrated by FIGS. 4A, 4B and 4C with an example of a resin-sealed type package as the semiconductor package, the present invention is not limited thereto but is applicable to packages of other types, for example, ceramic packages and the like.

As has been explained in details, according to the semiconductor packages of the present invention, the semiconductor chip and the condensers in a spiral-shaped form are formed by sealing them in the same package. Therefore, erroneous operation of the semiconductor chip can be prevented and adverse effect of noise on outside circuits can be reduced since noise derived from the outside or noise generated at the inside of the semiconductor chip which is caused by the formation of a fine structure of the semiconductor chip is absorbed by the condensers.

According to the semiconductor package of the present invention, a large capacity can be provided by the small volume of the condensers in a spiral-shaped form since the die pad, the capacitor in a spiral-shaped form adhered onto the upper face of the die pad and the semiconductor chip die-bonded onto the capacitor are formed by sealing them in the semiconductor package.

According to the semiconductor package of the present invention, the die pad, the semiconductor chip die-bonded onto one of the faces of the die pad and the capacitor in a spiral-shaped form adhered onto the other face of die pad, are formed by sealing them in the semiconductor package and therefore, the die bonding step of the semiconductor chip can be carried out without changing the conventional manufacturing steps whereby an increase in the manufacturing cost can be restrained.

According to the semiconductor package of the present invention, the die pad, the capacitor in a spiral-shaped form adhered onto the upper face of the die pad, the semiconductor chip die-bonded on the capacitor and another capacitor in a vortex-shaped form adhered onto the lower face of the die pad, are formed by sealing them in the semiconductor package and therefore, a larger capacity can be provided.

According to the semiconductor package of the present invention, the semiconductor chip and the capacitor at least one surface of opposed electrodes of which is roughened, are formed by sealing them in the same package. Therefore, noise derived from the outside or noise generated at the inside of the semiconductor chip which is caused in accordance with the fine structure formation of the semiconductor chip can be absorbed efficiently by the capacitor whereby erroneous operation of the semiconductor chip can be prevented and adverse effect of noise on outside circuits can be reduced.

According to the semiconductor package of the present invention, the die pad, the capacitor at least one surface of opposed electrodes is roughened, which is adhered onto the upper face of the die pad and the semiconductor chip die-bonded onto the condenser, are formed by sealing them in the semiconductor package and therefore, a large capacity with a small volume of the capacitor is provided.

According to the semiconductor package of the present invention, the die pad, the semiconductor chip die-bonded onto the upper face of the die pad and the capacitor at least one surface of opposed electrodes of which is roughened, which is adhered onto the lower face of the die pad, are formed by sealing them in the semiconductor package and accordingly, the die bonding step of the semiconductor chip can be carried out by using the conventional steps whereby an increase in the manufacturing cost can be restrained.

According to the semiconductor package of the present invention, the die pad, the capacitor in a spiral-shaped form, which is adhered onto the upper face of the die pad, the semiconductor chip die-bonded onto the capacitor and the capacitor at least one surface of opposed electrodes of which is roughened, which is adhered onto the lower face of the die pad, are formed by sealing them in the semiconductor package and therefore, a larger capacity can be provided.

While the above provides a full and complete disclosure of the preferred embodiments of the present invention, various modifications, alternate constructions and equivalents may be employed without departing from the true spirit and scope of the invention. Therefore the above description and illustration should not be construed as limiting the scope of the invention, which is defined by the appended claims.

What is claimed is:

1. A semiconductor package comprising:
   a die pad;
   a first capacitor adhered on a first face of the die pad;
   a semiconductor chip die-bonded on the first capacitor in the spiral-shaped form; and
   a second capacitor adhered on a second face of the die pad,
   wherein the semiconductor chip, the first capacitor and the second capacitor are connected to leads and sealed in the same package.

2. A semiconductor package according to claim 1, wherein the second capacitor comprises:
   a metal layer for power supply;
   a metal layer for grounding; and
   a dielectric body formed between the metal layer for a power supply and the metal layer for grounding,
   wherein the second capacitor has a spiral shape.

3. A semiconductor package according to claim 2, wherein the second capacitor is formed by rolling and flattening the metal layer for power source, the metal layer for grounding, and the dielectric body together.

4. A semiconductor package comprising:
   a semiconductor chip; and
   a capacitor including opposing electrodes, with at least one surface of said opposing electrodes being roughened;
   wherein the semiconductor chip and the capacitor are connected to leads and sealed in the same package.

5. A semiconductor package according to claim 4, wherein the semiconductor package comprises a die pad, the capacitor adhered onto a first face of the die pad and the semiconductor chip die-bonded onto the capacitor.

6. A semiconductor package according to claim 4, wherein the semiconductor package comprises a die pad, the semiconductor chip die-bonded onto a first face of the die pad and the capacitor adhered onto a second face of the die pad.

7. A semiconductor package according to claim 4, wherein the semiconductor package comprises a die pad, a capacitor in a spiral-shaped form adhered onto a first face of the die pad, the semiconductor chip die-bonded onto the capacitor in the spiral-shaped form and, the capacitor including opposing electrodes with at least one surface of said opposing electrodes being roughened, which is adhered onto a second face of the die pad.

8. A semiconductor package according to claim 4, wherein the capacitor comprises a metal layer for a power source; a metal layer for grounding; and a dielectric body formed between the metal layer for a power supply and a layer for grounding, and wherein faces of the metal layer for a power supply and the metal layer for grounding, which are opposed to each other, are roughened.

9. A semiconductor package according to claim 7, wherein the capacitor in a vortex-shaped form comprises:
   a first metal layer for a power source;
   a first metal layer for grounding; and
   a first dielectric body formed between the first metal layer for a power supply and the first metal layer for grounding,
   wherein the capacitor comprises:
   a second metal layer for a power source;
   a second metal layer for grounding; and
   a second dielectric body formed between the second metal layer for a power supply and the second metal layer for grounding, and
   wherein faces of the second metal layer for a power supply and the second metal layer for grounding, which are opposed to each other, are roughened.

10. A semiconductor package according to claim 8, wherein the opposed faces of the metal layer for a power supply and the metal layer for grounding are roughened by being formed in a plurality of waves.

11. A semiconductor package according to claim 8, wherein the opposed faces of the metal layer for a power supply and the metal layer for grounding are roughened by being formed in a plurality of dimples.

12. A semiconductor package according to claim 8, wherein the opposed faces of the metal layer for a power supply and the metal layer for grounding are roughened by being formed in a plurality of projections.

13. A semiconductor package according to claim 9, wherein the opposed faces of the second metal layer for a power supply and the second metal layer for grounding are roughened by being formed in a plurality of waves.

14. A semiconductor package according to claim 9, wherein the opposed faces of the second metal layer for a power supply and the second metal layer for grounding are roughened by being formed in a plurality of dimples.

15. A semiconductor package according to claim 9, wherein the opposed faces of the second metal layer for a power supply and the second metal layer for grounding are roughened by being formed in a plurality of projections.

16. A semiconductor package comprising:
   a die pad;
   a first capacitor adhered on a first face of the die pad wherein the first capacitor comprises: a metal layer for a power supply; a metal layer for grounding; and a dielectric body formed between the metal layer for a power supply and the metal layer for grounding, and wherein the first capacitor has a spiral shape; and
   a semiconductor chip die-bonded on the first capacitor,
   wherein the semiconductor chip and the first capacitor are connected to leads and sealed in the same package.

17. A semiconductor package according to claim 16, wherein the first capacitor is formed by rolling and flattening the metal layer for power source, the metal layer for grounding, and the dielectric body together.

18. A semiconductor package according to claim 16, wherein the metal layer for grounding of the first capacitor is connected electrically to the die pad grounded.

19. A semiconductor package according to claim 16, wherein the metal layer for grounding of the first capacitor is connected electrically to a lower surface of the semiconductor chip, and the lower surface is grounded.

* * * * *